United States Patent
Shrauger et al.

(10) Patent No.: US 6,633,426 B2
(45) Date of Patent: Oct. 14, 2003

(54) OPTICAL-ELECTRICAL MEMS DEVICES AND METHOD

(75) Inventors: Vernon Shrauger, Carlisle, MA (US); Bart Romanowicz, Somerville, MA (US); Matt Laudon, Marlborough, MA (US); Charles Hsu, Allston, MA (US)

(73) Assignee: Analog Devices, Inc., Canbridge, MA (US)

( * ) Notice: Subject to any disclaimer, the term of this patent is extended or adjusted under 35 U.S.C. 154(b) by 130 days.

(21) Appl. No.: 09/853,009

(22) Filed: May 10, 2001

(65) Prior Publication Data

US 2002/0167712 A1 Nov. 14, 2002

(51) Int. Cl.[7] ........................ G02B 26/00; B05D 5/06; H01S 3/10; H01L 29/82
(52) U.S. Cl. .................. 359/290; 359/292; 359/295; 359/224; 359/230; 427/162; 427/534; 372/20; 372/45; 257/415; 257/678; 348/771
(58) Field of Search ............................. 359/290, 291, 359/292, 295, 298, 224, 230; 348/771; 372/19, 20, 45; 427/162, 534; 257/415, 678, 723

(56) References Cited

U.S. PATENT DOCUMENTS

| | | | | |
|---|---|---|---|---|
| 6,123,985 A | * | 9/2000 | Robinson et al. | 427/162 |
| 6,404,534 B1 | * | 6/2002 | Chin et al. | 359/295 |
| 6,438,149 B1 | * | 8/2002 | Tayebati et al. | 372/45 |

* cited by examiner

Primary Examiner—Loha Ben
(74) Attorney, Agent, or Firm—Rines and Rines

(57) ABSTRACT

A novel optical-electrical MEMS device overlaid or covered with an optically transmissive substrate held spaced in inverted preferably flip-chip bonded fashion to the device, with transparent electrodes provided in the substrate for generating an upper mirror-actuating field to supplemental the customary lower mirror-well field, enabling complementary operation.

18 Claims, 1 Drawing Sheet

OPTICAL-ELECTRICAL MEMS DEVICES AND METHOD

FIELD

Figure 1:
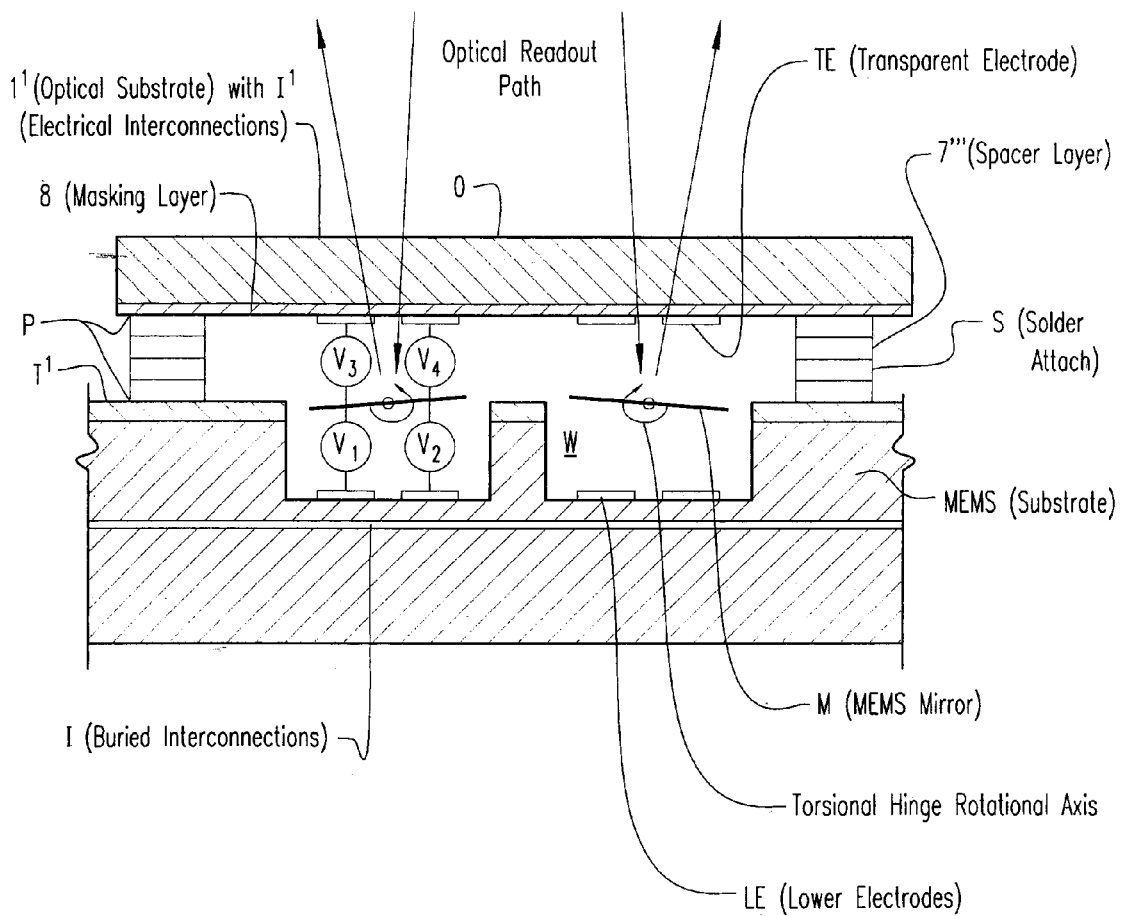

The present invention is concerned with improved MEMS devices and techniques as for use in optical switching and related applications; being more particularly, though not exclusively, directed to improvements in such devices wherein the MEMS device is flip-chip bonded to an optically transmissive printed-circuit substrate, as of the type, for example, described in co-pending application Serial No. 09/829,318 of co-applicant Vernon Shrauger entitled Improved Critically Aligned Optical MEMS Dies For Large Packaged Substrate Arrays and Method Of Manufacture and filed Apr. 9, 2001, and of common assignee, Axiowave, Inc. Such integrated optical substrates enable integration with passive and active optical devices therein or therealong, such as lenses, optical wave guides, lasers, photodetectors and the like, for optical interaction with the MEMS device containing electrical signal-controllable tiltable or orientable light-reflecting and directing mirrors, or other light-directing devices, such as valves, moving arms, shutter or other electromechanical structures and the like.

BACKGROUND

As explained in said copending application, light-transmissive substrates had been previously used for such purposes as serving as a package lid or the like; and now, in accordance with the invention of said co-pending application, with said passive and active optical devices integratable in or along the substrate for enabling controlled alignment or fixed optical light paths to and from the tiltable MEMS mirrors or the like, for switching the light signals amongst communication optical fiber bundles. The use of flip-chip bonding of superposed printed circuit optically transmissive substrates (circuits for optical addressing, etc.) by interposed spacer layer posts, enables non-interfacing unrestricted mirror tilting of the MEMS devices within the mirror wells, and the attachment with tight alignment of pluralities of MEMS devices in large packaged arrays. Such novel arrays of optically and electrically interacting optical MEMS dies are physically and electrically integrally attached upon an optically transmissive (preferably transparent) printed circuit substrate that is monolithically formed with one more optical components, such as lenses, for providing fixed optical path alignment and interaction therebetween, and with provision for the integration also of active optical components such as lasers and photodiodes and the like.

The electrical signal-controlled mirror deflecting, tilting or orienting about a torsion spring, hinge or other microactuator of prior MEMS devices, is generally effected with the aid of electrodes disposed in the bottom of the mirror wells and to which electrical voltages are applied responsive to, for example, desired optical path-switching signal controls. Such microtorsion actuators are described, for example, in an article entitled "Pull-In Study of an Electrostatic Torsion Microactuator" by Degani et al. appearing in the *Journal of Microelectromechanical Systems,* Volume 7, No. Dec. 4, 1998. The prior use of such substrates with tiltable mirror light path modulation control is illustrated, for example, in U.S. Pat. No. 6,046,840, having, however, inherent limited deflection angle of the tiltable mirror. And other proposals involving signal-deformable multi-layer mirrors are illustrated by exemplary U.S. Pat. Nos. 5,835, 255 and 5,949,801.

The present invention, however, through the use of the flip-chip bonded optically transmissive printed control circuit substrates of said co-pending application, has now further enabled greater and more facile positioning control of the electrical signal actuation of the MEMS mirrors; and, indeed, the generation of greater forces, including complementary forces, for such actuation than have heretofore been achievable with the bottom well field-generating electrodes of the prior MEMS devices. With electrodes both above and below the moving MEMS structure higher operating bandwidth and more stable control is possible. Electrostatic restoring forces may also be utilized instead of the mechanical restoring forces of elastic springs. This is achieved through the use of upper transparent electrodes in the optically transmissive substrate that do not impair the optical transmission therethrough and that enable supplementing the lower mirror-actuating field generated in the mirror well by the customary bottom electrodes therein, with an additional upper electrical control field from the top—this also enabling the above-mentioned desirable complementary type of control, as well.

OBJECTS OF INVENTION

A principal object of the invention, thus, is to provide such a new and improved MEMS device, particularly and preferably of the flip-chip bonded optically transmissive substrate structure, that enables the ready use of supplemental electrical control fields for orienting the MEMS mirrors or similar elements and that removes limitations in the operation of current MEMS devices.

A further object is to provide transparent electrodes with such optically transmissive structures, and a novel method for attaining such improved results.

Other and further objects will be explained hereinafter, and are more particularly delineated in the appended claims.

SUMMARY

In summary, however, from one of its important aspects, the invention embraces an optical-electrical MEMS device carrying an electrical signal-controllable orientable mirror and covered by an optically transmissive substrate mounted spaced above the mirror; and means for generating an upper electrical field in the space above the mirror and under said substrate for controlling the mirror orientation, preferably through the use of transparent electrodes carried by said substrate.

Preferred and best mode designs and embodiments are later more fully explained.

DRAWINGS

The invention will now be explained in connection with the accompanying drawing, the single FIGURE of which is a sectional view of a preferred embodiment of the invention, illustrating an implementation thereof, but only exemplary, embodying the features of the invention.

DESCRIPTION OF PREFERRED EMBODIMENTS(S)

Referring to the drawings, a MEMS device substrate (as of silicon, for example) is shown at "MEMS" containing tiltable-mirror wells W (two shown) within which mirrors M are mounted on torsional rotational hinges or gimbals, so-labeled, actually controlled in tilt or rotational orientation deflection angle by electrical signal-control fields (diagrammatically represented at $V_1$ and $V_2$), generated by the lower electrodes LE at the bottom plane of the wells W; such operation being more fully described in the before-referenced article and patents. The lower field produced by voltage $V_1$, for example, is schematically shown created by the "interconnection" from the control signal transistor T, by connections I buried in the MEMS substrate and connecting to the bottom electrodes LE.

As explained in said co-pending application the optically transmissive (transparent preferred) substrate $1^1$ should be minimally lossy to assure maximum optical power after passing through the completed and packaged assembly; and this substrate may be, for example, of gallium phosphide (GaP), silicon (Si) or other semi-conductor surfaces, sapphire, a glass composite or quartz, or any other material system that is transparent to the optical spectrum of interest and well-matched to the coefficient of thermal expansion of the silicon-based MEMS die. This substrate may carry printed-circuit like "electrical interconnections" I on its upper surface, as for providing optical addressing signals. It may be integrally formed with monolithically integrated passive or active optical components such as lenses, light-producing and transmitting lasers or photodetectors or receivers or the like, as before mentioned, and as schematically illustrated at O, for light-path interfacing with the substrate $1^1$. Such construction also enables strict optical path alignment for incoming light rays and outgoing mirror-reflected rays through the optical substrate $1^1$, as indicated by the heavy arrows at the top ("Optical readout path"). Where desired, masking layers 8 may be provided on the inner or bottom surface at appropriate areas. The optically transmissive substrate $1^1$, moreover, is shown inverted and flip-chip bonded upon the MEMS device by spacer layers or posts 7, conductively coated and solder-attached at S to conductive pads P on the upper surface of the MEMS substrate.

In accordance with the present invention, supplemental transparent electrodes TE may now be provided, as on the lower surface of the optically transmissive substrate $1^1$, activated by voltages $V_3$, $V_4$ applied by interconnections $I^1$ to create a supplemental upper field force actuating the mirrors M from the top. The mirror itself may be grounded, for example, so that the electric field can be applied by applying the voltage between the mirror and the electrodes.

The electrodes TE are transparent, as before mentioned, in order for the optical MEMS device to function. These supplemental upper electrodes TE can accordingly be built of indium tin-oxide, for example, a very common transparent conductor within the semiconductor industry, commonly found in liquid crystal displays. The electrodes TE are wired through interconnections and contact pads P on the transparent substrate $1^1$ itself, with appropriate material systems to ensure contact of the electrodes to the upper electrode control transistor $T^1$, through the solder attach S and the conductively plated spacer layers or posts 7, for driving the mirror-tilting actuator. The spacer posts 7 are now more than just spacers; they are also actually conductors providing electric fields from the substrate transparent electrodes TE which connect to the before-mentioned upper-electrode control transistor $T^1$ (shown embedded in the MEMS substrate) via the conductive spacer posts 7.

In summary, thus, the illustrative embodiment of the invention presented in the drawing demonstrates the transparent electrode approach for complementary fashion actuation of MEMS mirrors. This figure indicates that transistors, whether they are bipolar, CMOS or otherwise, are integrated with the MEMS. The MEMS device could, however, have electrodes above and below without integrated transistors, as by external electronics and interconnections on the MEMS or the OMCM die. The transistors are shown driving electrodes both above and below the MEMS device, schematically illustrated by the level voltages applied to the MEMS device to drive the mirror in rotation. The mirror, as earlier explained, is suspended with a torsional hinge that provides the restoring force driving the mirror to zero angle rotation as is well-known and described in the previously cited article. With equally sized electrodes and gaps between the mirror and electrodes above and below the mirror, the voltages $V_1$ and $V_3$ and $V_2$ and $V_4$ would be equal, respectively, to drive the mirror to some angle. For the exemplary rotation position shown, $V_1$ and $V_3$ would be set to some value V, and $V_2$ and $V_4$ would be set to zero, in the case of a single-ended drive scheme. As before mentioned, moreover, the use of electrodes above and below the moving MEMS structure also enables the utilization of electrostatic restoring force distribution to control and enhance the dynamic behavior and response of the MEMS device.

As before mentioned, variations in the optical substrate-MEMS device structure may also be used, and other optical-electrical or related devices besides mirrors may also be controlled in accordance with the technique of the present invention, and the control system may also be used with other types of field-generating electrode or related structures; and further modifications will also occur to those skilled in this art and are considered to fall within the spirit and scope of the invention as defined in the appended claims.

What is claimed is:

1. An optical-electrical MEMS device carrying an electrical signal-controllable orientable mirror and covered by an optically transmissive substrate mounted spaced above the mirror; and means for generating an upper electrical field in the space above the mirror and under said substrate for controlling the mirror orientation.

2. The MEMS device as claimed in claim 1 wherein the electrical field generating means comprises transparent or light-transmissive electrodes disposed on said substrate.

3. The MEMS device as claimed in claim 2 wherein the mirror is mounted in a well of the device and is also controlled by a further lower electrical field generated in the well below the mirror.

4. The MEMS device as claimed in claim 3 wherein means is provided for operating the upper and lower electrical fields in complementary fashion.

5. The MEMS device as claimed in claim 3 wherein means is provided to apply dynamically advantageous upper and lower electrostatic force distributions to enhance the dynamic behavior and response of the MEMS device.

6. The MEMS device as claimed in claim 5 wherein electrostatic restoring forces are provided.

7. An optical-electrical MEMS device carrying an electrical signal-controllable orientable mirror mounted within a well in the device and provided with electrodes for applying a lower voltage field within the well below the mirror for generating electrical signals for controlling the orientation of the mirror within the well; an optically-transmissive substrate integrally attached by spacer posts to cover or overlay the MEMS device and its mirror-mounting well, but providing sufficient space between the substrate and the mirror to avoid interference with the orienting operation of the mirror; and transparent electrodes provided on the optically-transmissive substrate for applying an upper voltage field above the well to supplement the lower voltage field within the well in controlling the electrical signal-orientable mirror.

8. The MEMS device of claim 7 wherein the mirror is torsion-spring mounted within the well and orientable in response to the field voltages.

9. The MEMS device of claim 7 wherein the transparent electrodes are provided at the lower surface of the substrate facing the MEMS device mirror and well.

10. The MEMS device of claim 9 wherein the substrate carries passive optical components monolithically integrated into the light-transmissive substrate and optically interacting therewith.

11. The MEMS device of claim 9 wherein the substrate carries active optical elements including light-producing, transmitting, receiving or detecting elements attached thereto for light-path interfacing therewith.

12. The MEMS device of claim 7 wherein the lower and upper voltage fields operate upon the mirror in complementary fashion.

13. The MEMS device of claim 7 wherein said spacer posts are conductive, enabling applying electrical signals from the MEMS device to the transparent electrodes.

14. The MEMS device of claim 13 wherein the substrate is invertedly flip-chip bonded to the device.

15. In an optical and electrical MEMS device carrying an electrical signal-orientable mirror suspended within a well in the device and wherein the device is physically and electrically integrally overlaid by an optically transmissive substrate carrying a pattern of printed electrical circuit interconnections but with sufficient upper clearance between the substrate and the mirror to avoid interference with the operation of the mirror as it is signal oriented by the field within the well, a method of supplementing electrical signal field control of the mirror, that comprises, providing transparent electrodes on the substrate in the region where it overlies the well and mirror, and applying voltage by said transparent electrodes to generate an upper electrical field above the mirror and well to supplement the signal orienting the mirror.

16. The method of claim 15 wherein the mirror is torsion-spring mounted within the well and is orientable in response to both the upper and lower electrical fields.

17. The method of claim 16 wherein the electrical fields are operated in complementary fashion.

18. The method of claim 16 wherein the MEMS device is orientable together with a plurality of successive similar MEMS devices to operate as an array of signal-orientable mirrors in response to optical addressing through the respective optically transmissive substrates of the devices.

* * * * *